(12) United States Patent
Tan (10) Patent No.: US 9,324,633 B2
(45) Date of Patent: Apr. 26, 2016

(54) MULTI-LEVEL PACKAGE ASSEMBLY HAVING CONDUCTIVE VIAS COUPLED TO CHIP CARRIER FOR EACH LEVEL AND METHOD FOR MANUFACTURING THE SAME

(71) Applicant: Silergy Semiconductor Technology (Hangzhou) Ltd., Hangzhou, Zhejiang (CN)

(72) Inventor: Xiaochun Tan, Zhejiang (CN)

(73) Assignee: SILERGY SEMICONDUCTOR TECHNOLOGY (HANGZHOU) LTD., Hangzhou, Zhejiang (CN)

(*) Notice: Subject to any disclaimer, the term of this patent is extended or adjusted under 35 U.S.C. 154(b) by 0 days.

(21) Appl. No.: 14/584,616

(22) Filed: Dec. 29, 2014

(65) Prior Publication Data

US 2015/0187738 A1    Jul. 2, 2015

(30) Foreign Application Priority Data

Dec. 31, 2013  (CN) .......................... 2013 1 0755505

(51) Int. Cl.
*H01L 23/495* (2006.01)
*H01L 23/02* (2006.01)
(Continued)

(52) U.S. Cl.
CPC ........ *H01L 23/481* (2013.01); *H01L 21/31133* (2013.01); *H01L 21/56* (2013.01);
(Continued)

(58) Field of Classification Search
CPC . H01L 25/0657; H01L 49/838; H01L 23/481; H01L 21/31133; H01L 23/3107; H01L 25/50; H01L 21/563; H01L 21/76897; H01L 2225/06541; H01L 2225/0651; H01L 2225/06513; H01L 2225/06506; H01L 2225/06517; H01L 23/49575; H01L 25/043; H01L 25/074; H01L 25/0756; H01L 25/117; H01L 23/482

USPC .......................... 257/676, 686, 777, 786, 790
See application file for complete search history.

(56) References Cited

U.S. PATENT DOCUMENTS

| | | | |
|---|---|---|---|
| 8,492,884 B2 * | 7/2013 | Pruitt ............................ | 257/676 |
| 2010/0019362 A1 | 1/2010 | Galera et al. | |

(Continued)

FOREIGN PATENT DOCUMENTS

| | | |
|---|---|---|
| CN | 101241904 | 8/2008 |
| CN | 102832189 | 12/2012 |

(Continued)

OTHER PUBLICATIONS

Office Action dated Dec. 14, 2015 from CN 201310755505.4.

*Primary Examiner* — A. Sefer
*Assistant Examiner* — Dilinh Nguyen
(74) *Attorney, Agent, or Firm* — Beyer Law Group LLP (57) ABSTRACT

A package assembly and a method for manufacturing the same are disclosed. The package assembly includes semiconductor chips, encapsulant layers, and a chip carrier. The plurality of semiconductor chips are stacked in a plurality of levels, including a lowermost level and at least one upper level. The plurality of encapsulant layers cover respective levels of semiconductor chips. The chip carrier is used for mounting lowermost-level semiconductor chips. At least one upper-level semiconductor chips are electrically coupled to the chip carrier by conductive traces. The conductive traces include extension conductors on a surface of a lower-level encapsulant layer and conductive vias which penetrate the lower-level encapsulant layer and are exposed at a bottom surface of the package assembly. The package assembly has improved high-frequency performance while having a small size and supporting multifunctionality.

19 Claims, 9 Drawing Sheets

(51) Int. Cl.
  *H01L 23/48* (2006.01)
  *H01L 23/52* (2006.01)
  *H01L 29/40* (2006.01)
  *H01L 23/29* (2006.01)
  *H01L 21/768* (2006.01)
  *H01L 21/311* (2006.01)
  *H01L 23/538* (2006.01)
  *H01L 21/56* (2006.01)
  *H01L 23/31* (2006.01)
  *H01L 23/498* (2006.01)
  *H01L 23/00* (2006.01)

(52) U.S. Cl.
  CPC ...... *H01L21/76897* (2013.01); *H01L 23/3135* (2013.01); *H01L 23/49572* (2013.01); *H01L 23/49575* (2013.01); *H01L 23/49827* (2013.01); *H01L 23/5389* (2013.01); *H01L 23/3107* (2013.01); *H01L 23/49838* (2013.01); *H01L 24/06* (2013.01); *H01L 24/13* (2013.01); *H01L 24/16* (2013.01); *H01L 24/48* (2013.01); *H01L 2224/04042* (2013.01); *H01L 2224/06135* (2013.01); *H01L 2224/131* (2013.01); *H01L 2224/13147* (2013.01); *H01L 2224/16245* (2013.01); *H01L 2224/48091* (2013.01); *H01L 2224/48247* (2013.01); *H01L 2224/81801* (2013.01)

(56) References Cited

U.S. PATENT DOCUMENTS

| | | |
|---|---|---|
| 2011/0285009 A1 | 11/2011 | Chi et al. |
| 2012/0248521 A1* | 10/2012 | Herbsommer et al. ....... 257/299 |
| 2014/0070390 A1 | 3/2014 | Tan et al. |

FOREIGN PATENT DOCUMENTS

| | | |
|---|---|---|
| CN | 103400819 | 11/2013 |
| CN | 103545297 | 1/2014 |
| CN | 103633058 | 3/2014 |
| CN | 103700639 | 4/2014 |
| CN | 203521406 U | 4/2014 |

* cited by examiner

MULTI-LEVEL PACKAGE ASSEMBLY HAVING CONDUCTIVE VIAS COUPLED TO CHIP CARRIER FOR EACH LEVEL AND METHOD FOR MANUFACTURING THE SAME

CLAIM OF PRIORITY

This application claims priority to Chinese Application No. 201310755505.4, filed on Dec. 31, 2013 (published as CN 103700639A), which is hereby incorporated by reference.

BACKGROUND OF THE INVENTION

1. Field of the Invention

The present disclosure relates to semiconductor technology, and more particularly, to a package assembly having semiconductor chips stacked one on another and a method for manufacturing the same.

2. Description of the Related Art

With an increasing demand for miniaturization, light weight and multifunctionality of electronic devices, a semiconductor package is developed towards a high packaging density so that a package size can be reduced. A package assembly using a chip carrier and encapsulating a plurality of semiconductor chips has attracted attention. The chip carrier is, for example, a leadframe. A semiconductor chip is encapsulated in an encapsulant and electrically connected to external circuits by the leadframe. In other cases, the chip carrier is a printed circuit board. A semiconductor chip is mounted on the printed circuit board and electrically connected to external circuits by the printed circuit board. In such package assembly, configuration of the semiconductor chips and their connections have significant effects on the package size and properties of the electronic devices.

Figure 1:
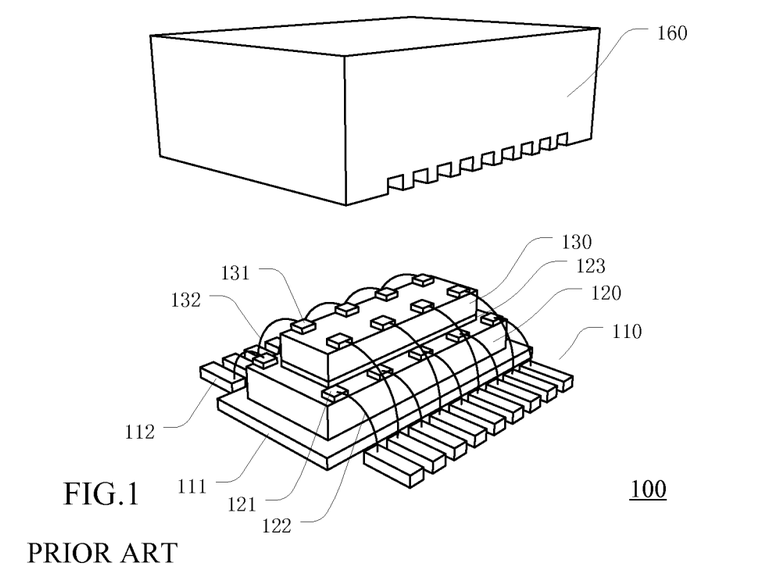
FIG. 1 is a perspective view showing a multi-level package assembly according to the prior art.

FIG. 1 is a perspective view showing a multi-level package assembly 100 according to the prior art. In the package assembly 100, the leadframe 110 includes a chip pad 111 and a plurality of finger-like leads 112. In a case that semiconductor chips are mounted on the leadframe 110 in two levels, as shown in FIG. 1, a lower-level semiconductor chip 120 has a bottom surface secured on the chip pad 111, and an upper-level semiconductor chip 130 has a bottom surface attached to a top surface of the beneath semiconductor chip 120 by means of an adhesive 123. Contact pads 121 are disposed at edges of the top surface of the semiconductor chip 120 and then electrically connected to the leads 112 by means of bonding wires 122. Contact pads 131 are disposed at a top surface of the semiconductor chip 130 and then electrically connected to the leads 112 by means of bonding wires 132. The leadframe 110 and the semiconductor chips 120 and 130 are encapsulated by an encapsulant layer 160. Outward portions of the leads 112 of the leadframe 110 are exposed from the encapsulant layer 160, for an electric connection with external circuits, such as a PCB (i.e. printed circuit board).

In the package assembly 100 according to the prior art, the semiconductor chip 130 needs to have a dimension (width, length, or both) smaller than that of the semiconductor chip 120 so that the edges of the beneath semiconductor chip 120 are exposed, which limits allowable size of the semiconductor chip.

Moreover, all of the input and output terminals of the semiconductor chips 120 and 130 need to be provided at the leads 112 of the leadframe 110 after being connected thereto by means of bonding wires 122 and 132. A number of the bonding wires may interference with each other, which results in poor high-frequency performance. Interconnect areas, with the number corresponding to the bonding wires, need to be provided at surfaces of the leads 112 of the leadframe 110. Consequently, the package assembly has a large size. Otherwise, less number of leads can be provided in the package assembly, which means less functionalities of the package assembly.

It is desirable that the multi-level package assembly has a small size with multifunctionality while improving electrical performance.

BRIEF DESCRIPTION OF THE INVENTION

One object of the present disclosure is to provide an improved package assembly, which solves the problems of adverse effects of bonding wires on the size and the electrical performance of a conventional package assembly.

According to one aspect of the present disclosure, there is provided a package assembly comprising: a plurality of semiconductor chips stacked in a plurality of levels, including a lowermost level and at least one upper level; a plurality of encapsulant layers covering respective levels of said semiconductor chips; and a chip carrier for mounting lowermost-level semiconductor chips, wherein at least one upper-level semiconductor chip is electrically coupled to the chip carrier by conductive traces, and the conductive traces comprise extension conductors on a surface of a lower-level encapsulant layer and conductive vias which penetrate the lower-level encapsulant layer and are exposed at a bottom surface of the package assembly.

Preferably, each of the conductive vias has a bottom end as a contact for an electrical connection.

Preferably, the at least one upper-level semiconductor chip has a size larger than, smaller than or equal to that of a lower-level semiconductor chip.

Preferably, the plurality of semiconductor chips are arranged with a bonding surface faced up or in a flip-chip manner.

Preferably, at least one level of semiconductor chips are arranged with a bonding surface faced up and are electrically coupled to surfaces of the extension conductors by bonding wires.

Preferably, at least one level of semiconductor chips are arranged in a flip-chip manner and have conductive bumps for being soldered to surfaces of the extension conductors.

Preferably, the plurality of levels are two or more levels.

Preferably, the chip carrier is one selected from a group consisting of a leadframe and a printed circuit board.

According to another aspect of the present disclosure, there is provided a method for manufacturing a package assembly, comprising: a) mounting lowermost-level semiconductor chips on a chip carrier; b) encapsulating the lowermost-level semiconductor chips by an encapsulant layer; c) forming extension conductors on a surface of a lower-level encapsulant layer; d) mounting upper-level semiconductor devices on the extension conductors; and e) encapsulating the upper-level semiconductor chips by an encapsulant layer, wherein conductive vias are disposed before forming the extension conductors for the upper-level semiconductor devices so that the conductive vias penetrate the lower-level encapsulant layer and are exposed at a bottom surface of the package assembly.

Preferably, the steps c) to e) are repeated so that a plurality of semiconductor chips are stacked in a plurality of upper levels.

Preferably, before the step a), the method further comprises disposing conductive vias for all of the upper-level semiconductor chips.

Preferably, between the step a) and the step b), the method further comprises disposing conductive vias for first upper-level semiconductor chips.

Preferably, between the step b) and the step c) for first upper-level of semiconductor chips, the method comprises disposing conductive vias for first upper-level semiconductor chips.

Preferably, between the step d) and the step e) for previous upper-level of semiconductor chips, the method further comprises disposing conductive vias for subsequent upper-level of semiconductor chips.

Preferably, between the step e) for previous upper-level of semiconductor chips and the step c) for subsequent upper-level of semiconductor chips, the method further comprises disposing conductive vias for the subsequent upper-level of semiconductor chips.

Preferably, the step of disposing the conductive vias comprises disposing preformed conductive vias.

Preferably, the step of disposing the conductive vias comprises forming openings in the encapsulant layer for encapsulating the previous upper-level semiconductor chips, and forming conductive vias in the openings.

Preferably, each level of the semiconductor chips are arranged with a bonding surface faced up or in a flip-chip manner.

Preferably, the step c) comprises: forming a metal layer by plating on an encapsulant layer for encapsulating a previous upper-level semiconductor chips; forming a photoresist mask on the metal layer; and patterning the metal layer into the extension conductors by etching through the photoresist mask.

In the package assembly according to the present disclosure, at least one of the upper-level semiconductor chips is mounted on the extension conductors, instead of being adhered to a lower-level semiconductor chip. The semiconductor chips in two adjacent levels have no dimension dependence.

For the at least one of the upper-level semiconductor chips, at least portions of the bonding wires are replaced by conductive traces of extension conductors and conductive vias, which results in improved high-frequency performance.

Furthermore, each of the conductive vias has a bottom surface as a contact for an electrical connection, and no interconnect area is required and formed at surfaces of the leads of the leadframe for upper-level semiconductor chips. The upper-level semiconductor chip can have conductive bumps being soldered to the extension conductors, without interconnect areas to be formed at the conductive vias. The contact at the bottom surface of each of the conductive vias has a small size, and can be formed as a part of a dense contact array for the package assembly according to the present disclosure. Thus, the package assembly has a small size and supports multifunctionality.

BRIEF DESCRIPTION OF THE DRAWINGS

The above and other objects, advantages and features of the present invention will become more fully understood from the detailed description given hereinbelow in connection with the appended drawings, and wherein:

FIGS. 8A and 8B through 17A and 17B are top views and cross sectional views showing various steps of a method for manufacturing a multi-level package assembly according to the fifth embodiment of the present disclosure.

DETAILED DESCRIPTION OF EMBODIMENTS OF THE INVENTION

Exemplary embodiments of the present disclosure will be described in more details below with reference to the accompanying drawings. In the drawings, like reference numerals denote like members. The figures are not drawn to scale, for the sake of clarity. For simplicity, the package structure having been subject to several relevant process steps may be shown in one figure.

It should be understood that when one layer or region is referred to as being "above" or "on" another layer or region in the description of the package structure, it can be directly above or on the other layer or region, or other layers or regions may be intervened therebetween. Moreover, if the device in the figures is turned over, the layer or region will be "under" or "below" the other layer or region. In contrast, when one layer is referred to as being "directly on" or "on and adjacent to" or "adjoin" another layer or region, there are not intervening layers or regions present.

Some particular details of the present disclosure will be described below, such as exemplary structures, materials, dimensions, process steps and technologies of the package assembly, for better understanding of the present disclosure. However, it can be understood by one skilled person in the art that these details are not always essential for but can be varied in a specific implementation of the disclosure.

Figure 2:
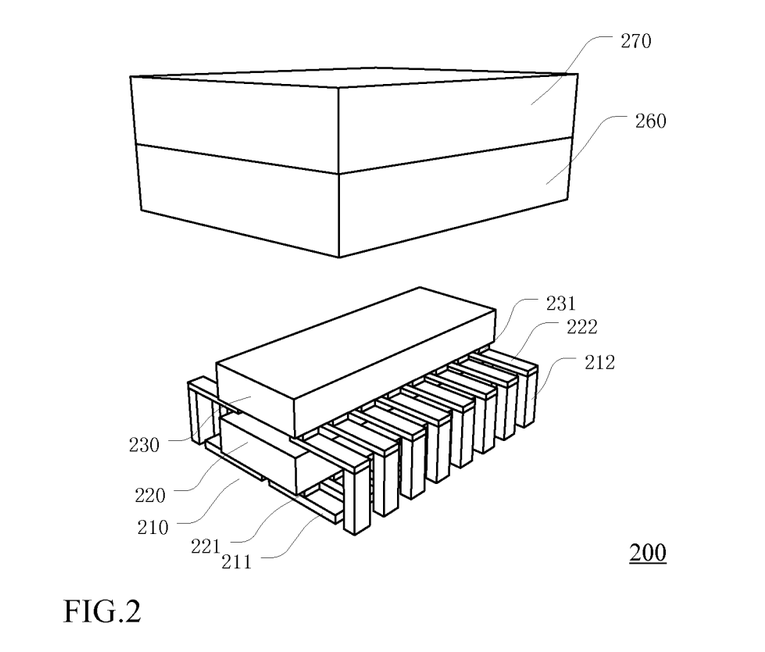
FIG. 2 is a perspective view showing a multi-level package assembly according to a first embodiment of the present disclosure.

FIG. 2 is a perspective view showing a multi-level package assembly 200 according to a first embodiment of the present disclosure. The encapsulant layers 260 and 270 are shown as being separated from other parts of the package assembly 200, only for the sake of clarity. In an example, the chip carrier is a leadframe 210. Semiconductor chips 220 and 230 are mounted in the package assembly 200 in a flip-chip manner.

The semiconductor chip 220 includes internal circuits and conductive bumps 221, such as solder bumps or copper bumps, which are electrically coupled to the internal circuits. A semiconductor chip 220 is mounted on the leadframe 210. The leadframe 210 includes finger-like leads 211. Conductive bumps 221 are provided at a bottom surface of the semiconductor chip 220, and are soldered to respective ones of the leads 211 by solder. The leadframe 210 and the semiconductor chip 220 are encapsulated by an encapsulant layer 260.

Here, the encapsulant layer 260 may be made of one selected from a group consisting of a molding compound, a ceramic and a metal. In a case that the encapsulant layer is made of a metal, an additional insulation layer may be provided for electrical insulation.

Bottom surfaces of the leads 211 of the leadframe 210 are exposed from the encapsulant layer 260, for an electric connection between the semiconductor chip 220 and external circuits, such as a PCB (i.e. printed circuit board). Moreover, the conductive vias 212 (for example, copper posts) penetrate the encapsulant layer 260. Each of the conductive vias 212 has a bottom end which is exposed at the bottom surface of the encapsulant layer 260, for an electric connection with external circuits, such as a PCB (i.e. printed circuit board).

The semiconductor chip 230 is arranged above the semiconductor chip 220, and includes internal circuits and conductive bumps 231 which are electrically coupled to the internal circuits. The conductive bumps 231 are disposed at the bottom surface of the semiconductor chip 230, and are soldered to the extension conductors 222 by solder. In an example, the extension conductors 222 are formed in a patterned metal layer on a surface of the encapsulant layer 260. The extension conductors 222 extend from the bottom surface of the semiconductor chip 230 to top surfaces of the conductive vias 212, so that the extension conductors 222 and the conductive vias 212 constitute together as conductive traces of the semiconductor chip 230 in the encapsulant layers. The conducive extension members 222 and the semiconductor chip 230 are encapsulated by a encapsulant layer 270.

Figure 3:
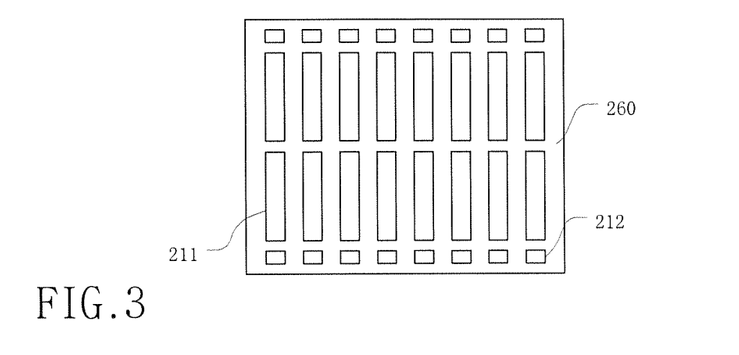
FIG. 3 is a bottom view showing a multi-level package assembly according to a first embodiment of the present disclosure.

FIG. 3 is a bottom view showing a multi-level package assembly 200 according to a first embodiment of the present disclosure. As mentioned above, the bottom surfaces of the leads 211 of the leadframe 210 are exposed at the bottom surface of the encapsulant layer 260. Furthermore, bottom ends of the conductive vias 212 are also exposed at the bottom surface of the encapsulant layer 260.

In the multi-level package assembly 200 according to the present disclosure, the bottom ends of the conductive vias 212 can be used directly as contacts for an electrical connection. Alternatively, the bottom ends of the conductive vias 212 may be attached with solder as contacts for an electrical connection. As shown in FIG. 3, the conductive vias 212 provide contacts with a small size at their bottom ends, constituting a dense contact array for the package assembly.

Figure 4:
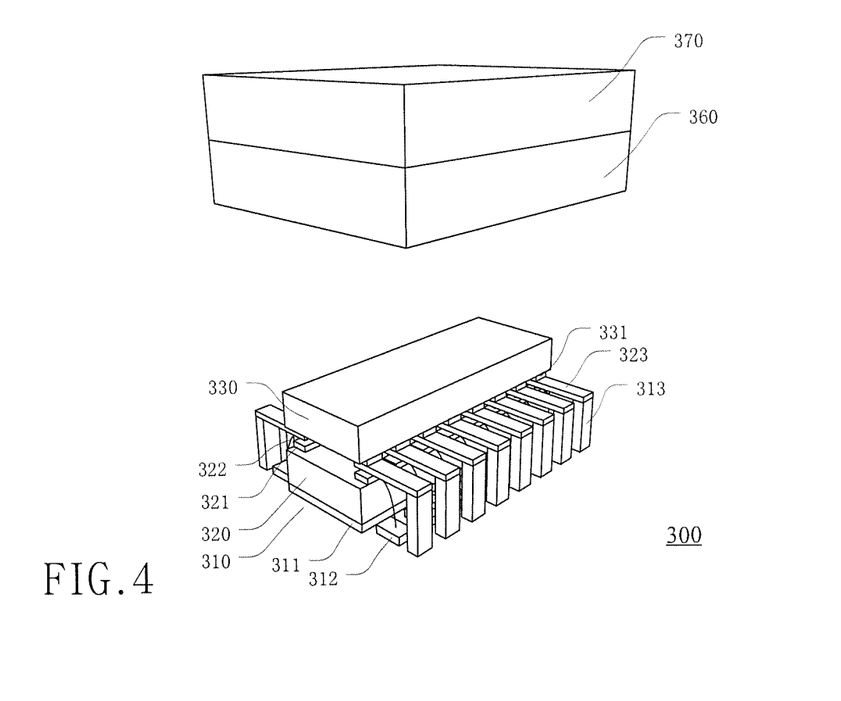
FIG. 4 is a perspective view showing a multi-level package assembly according to a second embodiment of the present disclosure.

FIG. 4 is a perspective view showing a multi-level package assembly 300 according to a second embodiment of the present disclosure. The encapsulant layers 360 and 370 are shown as being separated from other parts of the package assembly 300, only for the sake of clarity. In an example, the chip carrier is a leadframe 310. In the package assembly 300, one semiconductor chip 320 is mounted with a bonding surface faced up, the other semiconductor chip 330 is mounted in a flip-chip manner.

The semiconductor chip 320 includes internal circuits and a plurality of contact pads 321 (for example, copper contact pads) which are electrically coupled to the internal circuits. The leadframe 310 includes a chip pad 311 and finger-like leads 312. The semiconductor chip 320 has a bottom surface secured on the chip pad 311. Contact pads 321 are disposed at a top surface of the semiconductor chip 320 and then electrically connected to the leads 312 by means of bonding wires 322. The leadframe 310 and the semiconductor chip 320 are encapsulated by an encapsulant layer 360.

Bottom surfaces of the leads 311 of the leadframe 310 are exposed from the encapsulant layer 360, for an electric connection between the semiconductor chip 320 and external circuits, such as a PCB (i.e. printed circuit board). Moreover, the conductive vias 313 (for example, copper posts) penetrate the encapsulant layer 360. Each of the conductive vias 313 has a bottom end which is exposed at the bottom surface of the encapsulant layer 360, for an electric connection with external circuits, such as a PCB (i.e. printed circuit board).

The semiconductor chip 330 is arranged above the semiconductor chip 320, and includes internal circuits and conductive bumps 331 which are electrically coupled to the internal circuits. The conductive bumps 331 are disposed at the bottom surface of the semiconductor chip 330, and are soldered to the extension conductors 322 by solder. In an example, the extension conductors 322 are formed in a patterned metal layer on a surface of the encapsulant layer 360. The extension conductors 322 extend from the bottom surface of the semiconductor chip 330 to top surfaces of the conductive vias 313, so that the extension conductors 322 and the conductive vias 313 constitute together as conductive traces of the semiconductor chip 330 in the encapsulant layers. The conducive extension members 322 and the semiconductor chip 330 are encapsulated by a encapsulant layer 370.

Different from the package assembly 100 according to the prior art, which is shown in FIG. 1, the package assembly 300 according to the present disclosure introduces the extension conductors 322 and the conductive vias 313 as conductive traces for the upper-level semiconductor chip 330, to replace at least portions of the bonding wires.

Figure 5:
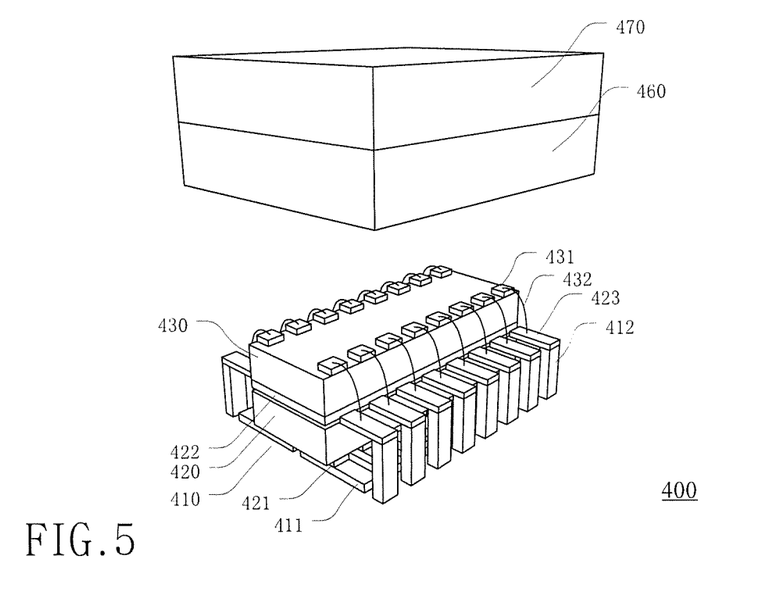
FIG. 5 is a perspective view showing a multi-level package assembly according to a third embodiment of the present disclosure.

FIG. 5 is a perspective view showing a multi-level package assembly 400 according to a third embodiment of the present disclosure. The encapsulant layers 460 and 470 are shown as being separated from other parts of the package assembly 400, only for the sake of clarity. In an example, the chip carrier is a leadframe 410. In the package assembly 400, one semiconductor chip 420 is mounted in a flip-chip manner, the other semiconductor chip 430 is mounted with a bonding surface faced up.

The semiconductor chip 420 includes internal circuits and conductive bumps 421, such as solder bumps or copper bumps, which are electrically coupled to the internal circuits. A semiconductor chip 420 is mounted on the leadframe 410. The leadframe 410 includes finger-like leads 411. Conductive bumps 421 are provided at a bottom surface of the semiconductor chip 420, and are soldered to respective ones of the leads 411 by solder. The leadframe 410 and the semiconductor chip 420 are encapsulated by an encapsulant layer 460.

Bottom surfaces of the leads 411 of the leadframe 410 are exposed from the encapsulant layer 460, for an electric connection between the semiconductor chip 420 and external circuits, such as a PCB (i.e. printed circuit board). Moreover, the conductive vias 412 (for example, copper posts) penetrate the encapsulant layer 460. Each of the conductive vias 412 has a bottom end which is exposed at the bottom surface of the encapsulant layer 460, for an electric connection with external circuits, such as a PCB (i.e. printed circuit board).

The semiconductor chip 430 is arranged above the semiconductor chip 420, and includes internal circuits and contact pads 431 (for example, copper contact pads) which are electrically coupled to the internal circuits. The semiconductor chip 430 has a bottom surface secured on the chip pad 422. Contact pads 431 are disposed at a top surface of the semiconductor chip 430 and then electrically connected to the extension conductors 423 by means of bonding wires 432. In an example, the chip pad 422 and the extension conductors 423 are formed in a patterned metal layer on a surface of the encapsulant layer 460. The extension conductors 423 extend from the bottom surface of the semiconductor chip 430 to top surfaces of the conductive vias 412, so that the extension conductors 423 and the conductive vias 412 constitute together as conductive traces of the semiconductor chip 430 in the encapsulant layers. The conducive extension members 423 and the semiconductor chip 430 are encapsulated by a encapsulant layer 470.

Different from the package assembly 100 according to the prior art, which is shown in FIG. 1, the package assembly 400 according to the present disclosure introduces the extension conductors 423 and the conductive vias 412 as conductive traces for the upper-level semiconductor chip 430, to replace at least portions of the bonding wires.

Figure 6:
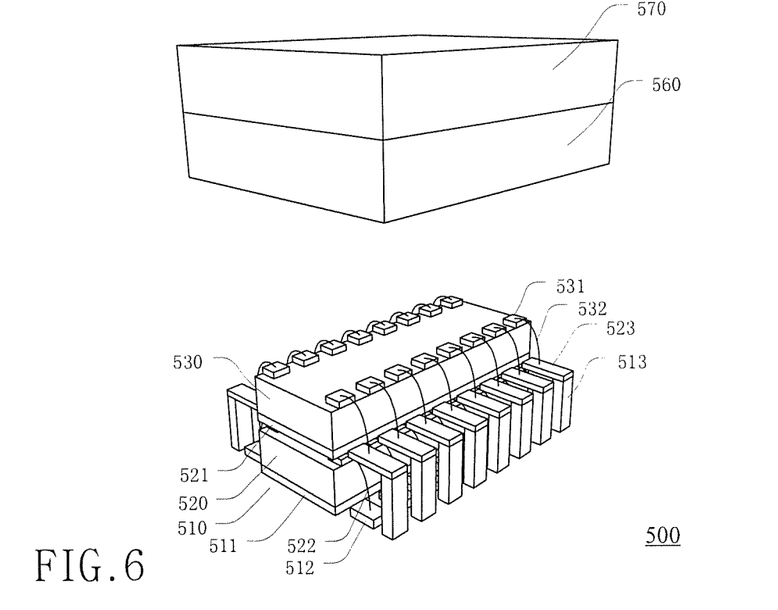
FIG. 6 is a perspective view showing a multi-level package assembly according to a fourth embodiment of the present disclosure.

FIG. 6 is a perspective view showing a multi-level package assembly 500 according to a fourth embodiment of the present disclosure. The encapsulant layers 560 and 570 are shown as being separated from other parts of the package assembly 500, only for the sake of clarity. In an example, the chip carrier is a leadframe 510. In the package assembly 500, two semiconductor chips 520 and 530 are mounted with their bonding surfaces faced up.

The semiconductor chip 520 includes internal circuits and contact pads 521 (for example, copper contact pads) which are electrically coupled to the internal circuits. The leadframe 510 includes a chip pad 511 and finger-like leads 512. The semiconductor chip 520 has a bottom surface secured on the chip pad 511. Contact pads 521 are disposed at a top surface of the semiconductor chip 520 and then electrically connected to the leads 512 by means of bonding wires 522. The leadframe 510 and the semiconductor chip 520 are encapsulated by an encapsulant layer 560.

Bottom surfaces of the leads 511 of the leadframe 510 are exposed from the encapsulant layer 560, for an electric connection between the semiconductor chip 520 and external circuits, such as a PCB (i.e. printed circuit board). Moreover, the conductive vias 513 (for example, copper posts) penetrate the encapsulant layer 560. Each of the conductive vias 513 has a bottom end which is exposed at the bottom surface of the encapsulant layer 560, for an electric connection with external circuits, such as a PCB (i.e. printed circuit board).

The semiconductor chip 530 is arranged above the semiconductor chip 520, and includes internal circuits and contact pads 531 (for example, copper contact pads) which are electrically coupled to the internal circuits. The semiconductor chip 530 has a bottom surface secured on the chip pad 522. Contact pads 531 are disposed at a top surface of the semiconductor chip 530 and then electrically connected to the extension conductors 523 by means of bonding wires 532. In an example, the chip pad 522 and the extension conductors 523 are formed in a patterned metal layer on a surface of the encapsulant layer 560. The extension conductors 523 extend from the bottom surface of the semiconductor chip 530 to top surfaces of the conductive vias 513, so that the extension conductors 523 and the conductive vias 513 constitute together as conductive traces of the semiconductor chip 530 in the encapsulant layers. The conducive extension members 523 and the semiconductor chip 530 are encapsulated by a encapsulant layer 570.

Different from the package assembly 100 according to the prior art, which is shown in FIG. 1, the package assembly 500 according to the present disclosure introduces the extension conductors 523 and the conductive vias 513 as conductive traces for the upper-level semiconductor chip 530, to replace at least portions of the bonding wires.

In the above first to fourth embodiments, the package assembly is described as having semiconductor chips which are arranged in two levels. Alternatively, the package assembly may have semiconductor chips which are arranged in more than two levels. The lower-most semiconductor chips are mounted on the leadframe. At least one of the upper-level semiconductor chips is mounted on the extension conductors, and then is electrically coupled to external circuits by means of the conductive vias. The package assembly according to the present disclosure introduces the extension conductors and the conductive vias as conductive traces for at least one of the upper-level semiconductor chips, to replace at least portions of the bonding wires.

Figure 7:
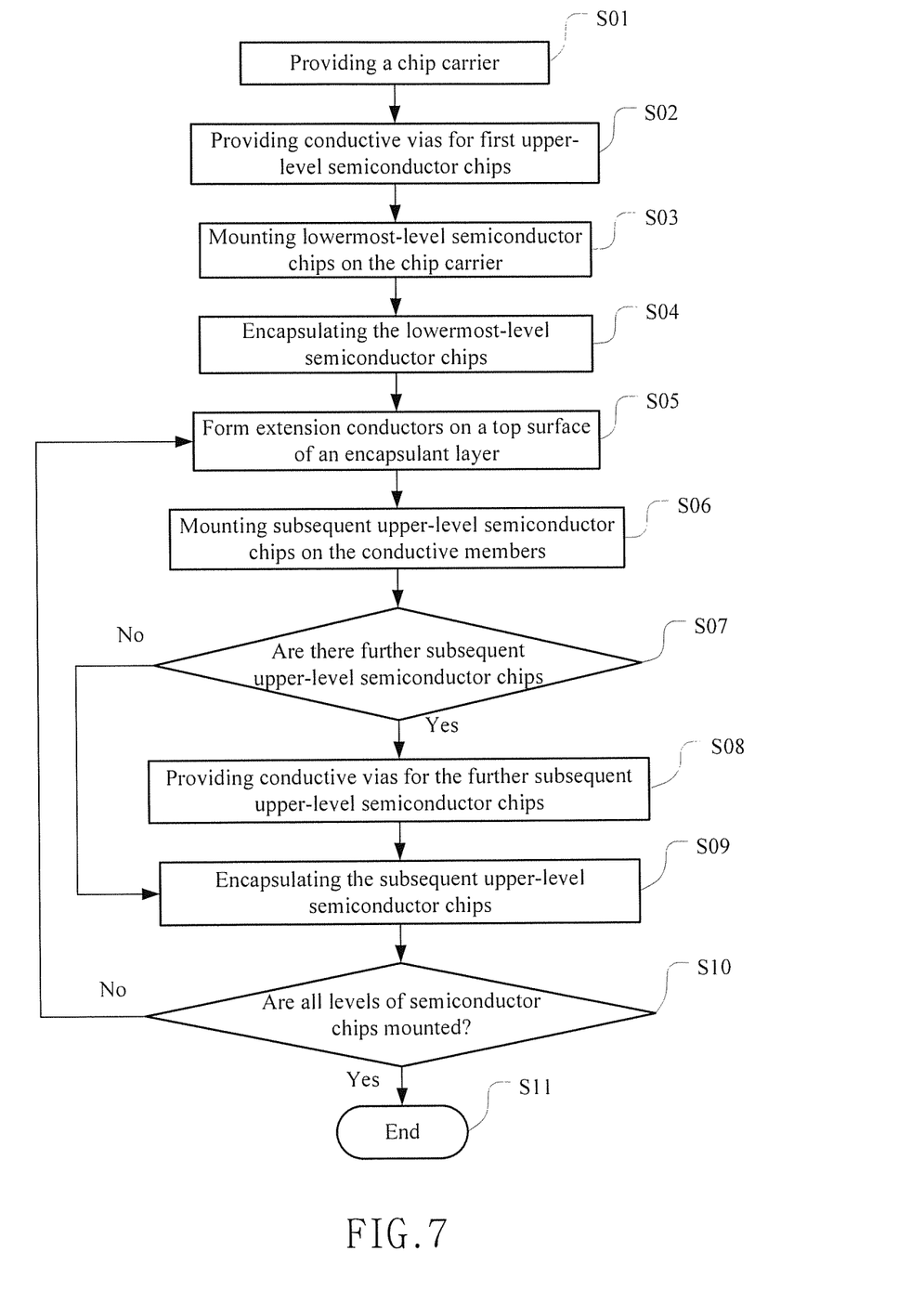
FIG. 7 is a flow chart of a method for manufacturing a multi-level package assembly according to a fifth embodiment of the present disclosure.
Figure 8A:
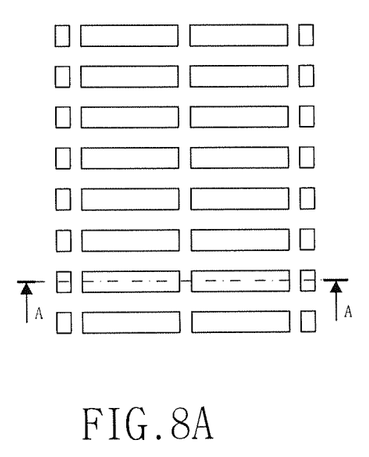

FIG. 7 is a flow chart of a method for manufacturing a multi-level package assembly according to a fifth embodiment of the present disclosure, and FIGS. 8A through 17B are top views and cross sectional views, showing various steps of a method for manufacturing a multi-level package assembly according to the fifth embodiment of the present disclosure. In FIG. 8A through to 17B, a top view of a package structure is labeled as "A", and a cross sectional view of the package structure is labeled as "B". Line AA is shown in the top view of FIG. 8A to indicate where all of the following cross sectional views are taken. The line AA crosses one row of leads of a leadframe and one row of conductive vias. The method is an example for manufacturing the package assembly 200 according to the first embodiment of the present disclosure, with only a variation that semiconductor chips 220, 230 and 240 are arranged in a flip-chip manner in three levels in the package assembly 200.

Figure 8B:
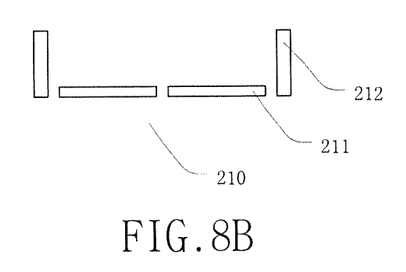

In step S01, the method is started with a chip carrier, such as a leadframe 210. In an example, the leadframe 210 is a copper frame formed by stamping, including a plurality of leads, each of which has a first surface for an interconnect area and a second surface, typically opposite to the first surface, for an electrical contact. In step S02, conducive vias 212 are provided for first upper-level semiconductor chips, as shown in FIGS. 8A and 8B. In an example, the conductive vias 212 are copper posts. The conductive vias 212 will be portions of conductive traces for first upper-level semiconductor chips, and each have a bottom end as an electrical contact. In an example, the conductive vias 212 are preformed members formed by stamping. Preferably, the bottom surface of the leadframe 210 and the bottom ends of the conductive vias 212 are coplanar. In an example, a placement tool is used for placing the conductive vias 212 to predetermined locations in the manufacture process.

Figures 9A, 9B:
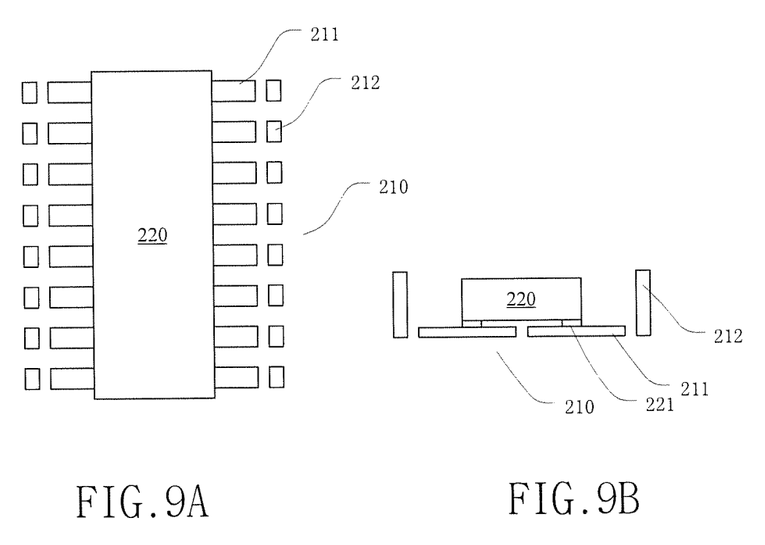
Figures 10A, 10B:
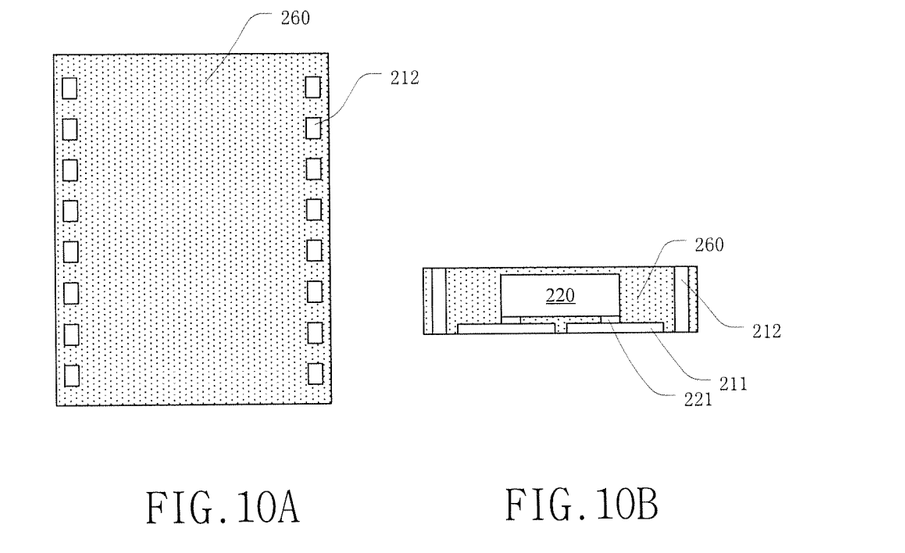

In step S03, the lowermost-level semiconductor chip 220 is mounted on the leadframe 210, as shown in FIGS. 9A and 9B. The semiconductor chip 220 includes internal circuits and conductive bumps 221, such as solder bumps or copper bumps, which are electrically coupled to the internal circuits. Conductive bumps 221 are provided at a bottom surface of the semiconductor chip 220, and are soldered to respective ones of the leads 211 by solder. In step S04, the leadframe 210 and the semiconductor chip 220 are encapsulated by an encapsulant layer 260, which is made of, for example, a molding compound, as shown in FIGS. 10A and 10B. A top surface of the encapsulant layer 260 is planarized so that top ends of the conductive vias 212 are exposed. That is, the conductive vias 212 penetrate the encapsulant layer 260. It should be noted that the top surface of the encapsulant layer 260 may also be planarized in selected areas. Consequently, the top surface of the encapsulant layer 260 is uneven, including two or more areas having different heights. The top ends of the conductive vias 212 can be lower than the top surface of the semiconductor chip 220, as long as the top ends of the conductive vias 212 are exposed.

Figure 11A:
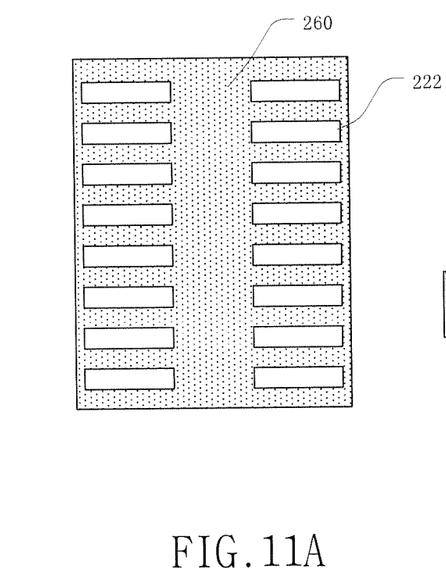
Figure 11B:
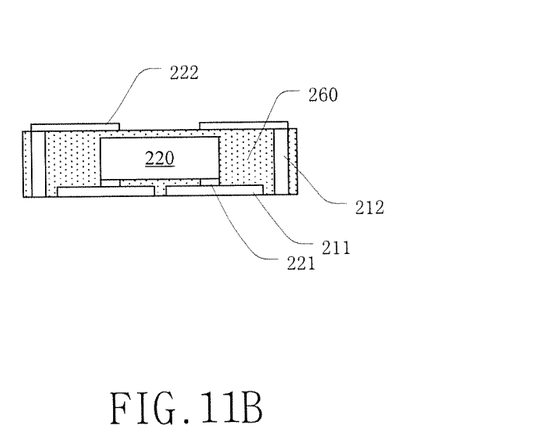

Next, a metal layer is formed by plating at the top surface of the encapsulant layer 260. A photoresist mask is formed on the metal layer to define a pattern of extension conductors. In step S05, exposed portions of the metal layer are removed completely by etching so that the metal layer is patterned into extension conductors 222, as shown in FIGS. 11A and 11B. Each of the extension conductors 222 has one end which will be located below a semiconductor chip, and the other end which extends to contact the top end of respective one of the conductive vias 212.

Figure 12A:
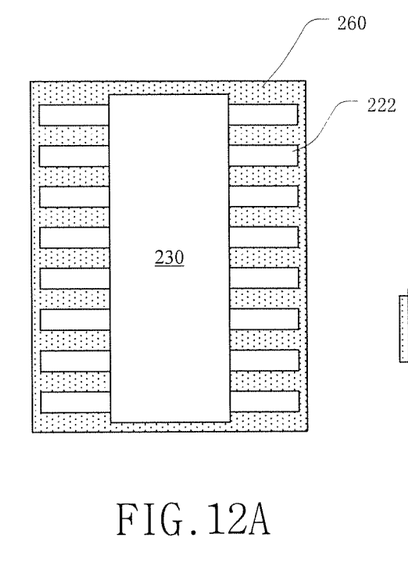
Figure 12B:
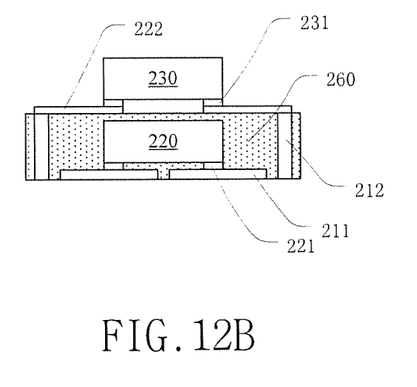

In step S06, a first upper-level semiconductor chip 230 is mounted on the extension conductors 212, as shown in FIGS. 12A and 12B. The semiconductor chip 230 includes internal circuits and conductive bumps 231, such as solder bumps or copper bumps, which are electrically coupled to the internal circuits. The conductive bumps 231 are disposed at the bottom surface of the semiconductor chip 230, and are soldered to the extension conductors 222 by solder. The extension conductors 222 and the conductive vias 212 constitute together as conductive traces of the semiconductor chip 230 in the encapsulant layers. In step S07, it is judged whether there are subsequent upper-level semiconductor chips. In this example, a second upper-level semiconductor chip 240 will be disposed.

Figure 13A:
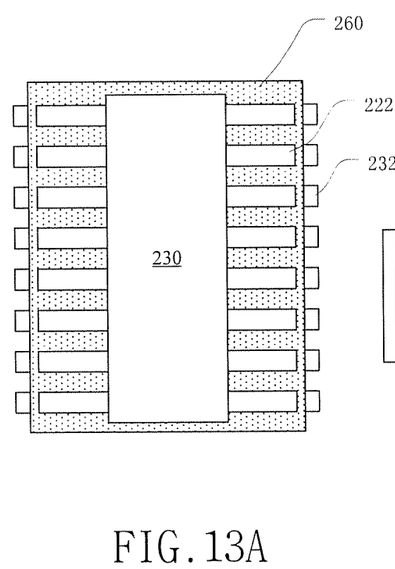
Figure 13B:
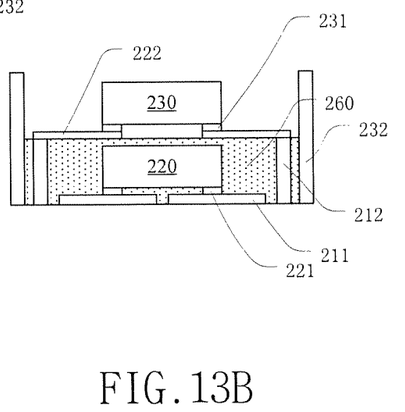

In step S08, conducive vias 232 are provided for the second upper-level semiconductor chip 240, as shown in FIGS. 13A and 13B. In an example, the conductive vias 232 are copper posts. The conductive vias 212 will be portions of conductive traces for the second upper-level semiconductor chip, and each have a bottom end as an electrical contact. Preferably, the bottom surface of the leadframe 210 and the bottom ends of the conductive vias 232 are coplanar.

Figures 14A, 14B:
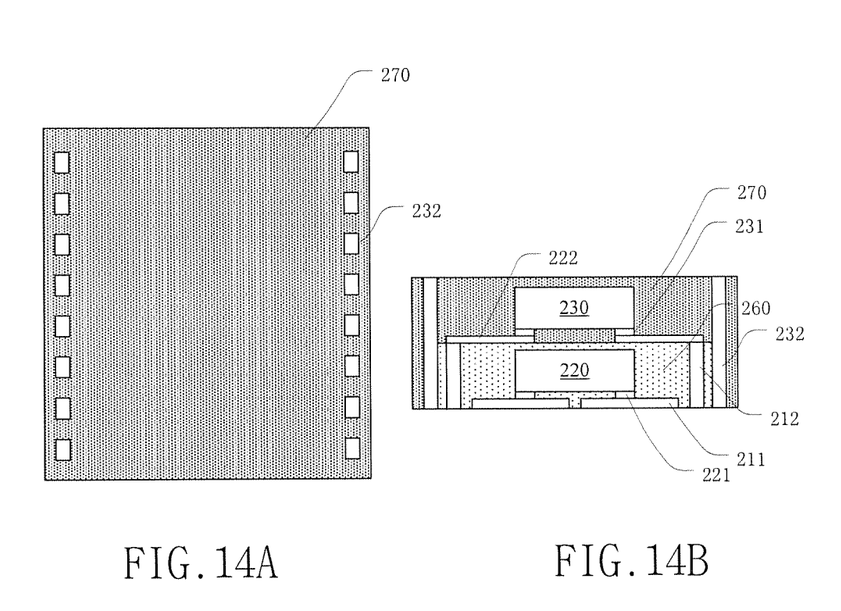

In step S09, the extension conductors 222, the conductive vias 232 and the semiconductor chip 230 are encapsulated by an encapsulant layer 270, which is made of, for example, a molding compound, as shown in FIGS. 14A and 14B. A top surface of the encapsulant layer 270 is planarized so that top ends of the conductive vias 232 are exposed. That is, the conductive vias 232 penetrate the encapsulant layer 270.

Figures 15A, 15B:
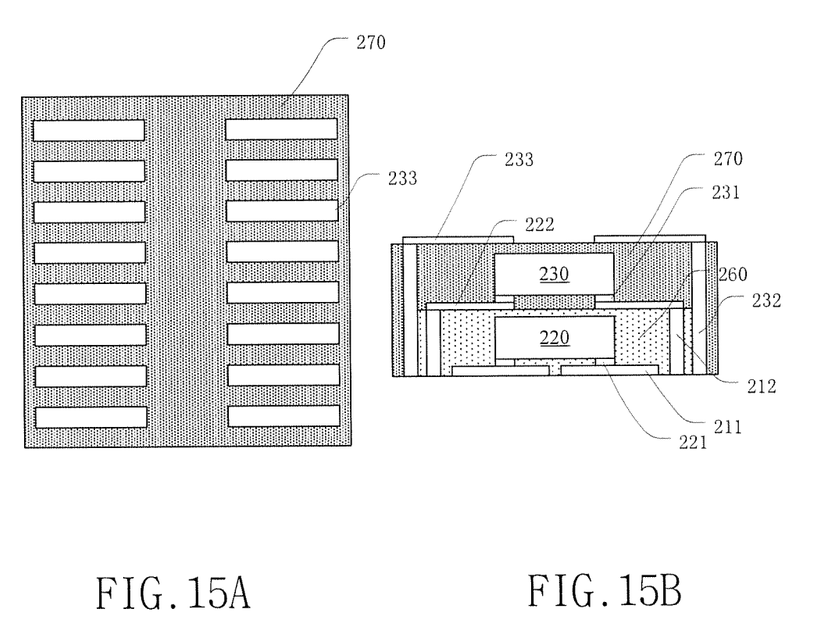
Figure 16A:
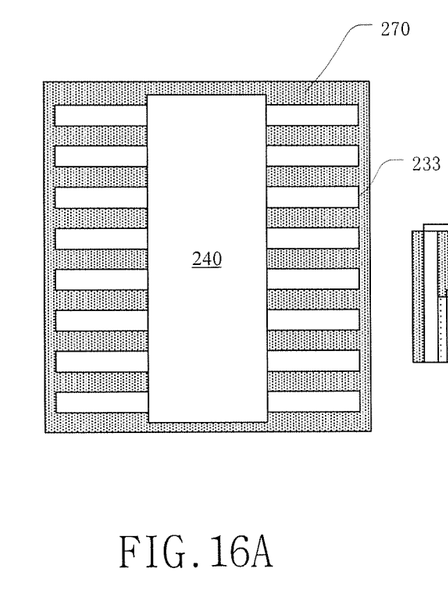
Figure 16B:
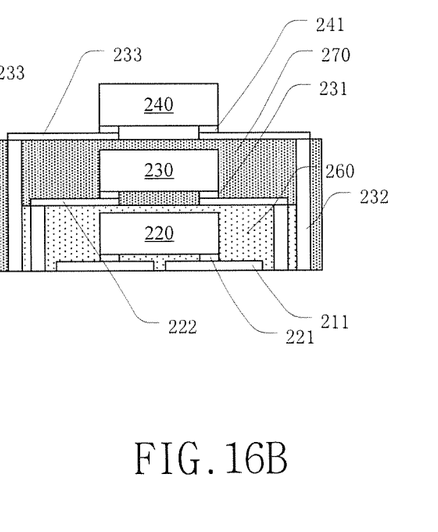
Figure 17A:
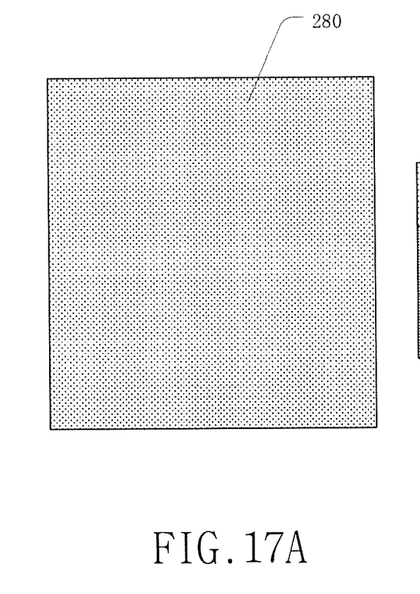
Figure 17B:
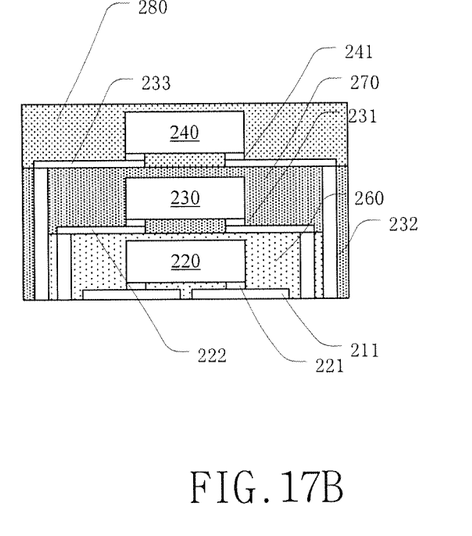

In step S10, it is judged whether all levels of the semiconductor chips are mounted. In this example, a second upper-level semiconductor chip will be disposed. Thus, the steps S05 to S09 are repeated. Extension conductors 233 are formed at a top surface of the encapsulant layer 270, as shown in FIGS. 15A and 15B. The semiconductor chip 240 is mounted on the extension conductors 233, as shown in FIGS. 16A and 16B. The extension conductors 233 and the semiconductor chip 240 are encapsulated by an encapsulant layer 280, which is made of, for example, a molding compound, as shown in FIGS. 17A and 17B. The conductive bumps 241 are disposed at the bottom surface of the semiconductor chip 240, and are soldered to the extension conductors 233 by solder. The extension conductors 233 and the conductive vias 232 constitute together as conductive traces of the semiconductor chip 240 in the encapsulant layers.

In the above fifth embodiment, the method for manufacturing a multi-level package assembly is described. For various upper-level semiconductor chips, the conductive vias are disposed for subsequent upper-level semiconductor chips before encapsulating previous upper-level semiconductor chips.

Alternatively, for various upper-level semiconductor chips, the conductive vias may be formed after encapsulating previous upper-level semiconductor chips and before mounting subsequent upper-level semiconductor chips. That is, the steps S08 and S09 are inverted. In an example, openings are firstly formed to penetrate all of the previous encapsulant layers, and then filled with a conductive material to form the conductive vias.

Still alternatively, in the above step S02, conductive vias may be disposed for all of the upper-level semiconductor chips, together with the leadframe. Consequently, the following steps S07 to S09 may be omitted.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . ." does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A package assembly comprising:
   a plurality of semiconductor chips stacked in a plurality of levels, including a lowermost level and at least one upper level;
   a plurality of encapsulant layers stacked in a plurality of levels, each encapsulating respective one level of said semiconductor chips and having a respective upper surface; and
   a chip carrier for mounting lowermost-level semiconductor chips,
   wherein at least one upper-level semiconductor chip is electrically coupled to said chip carrier by conductive traces, said conductive traces comprising:
      extension conductors formed on an upper surface of a lower-level encapsulant layer; and
      conductive vias which penetrate said lower-level encapsulant layer and are exposed at a bottom surface of said package assembly.

2. The package assembly according to claim 1, wherein each of said conductive vias has a bottom end as a contact for an electrical connection.

3. The package assembly according to claim 1, wherein said at least one upper-level semiconductor chip has a size larger than, smaller than or equal to that of a lower-level semiconductor chip.

4. The package assembly according to claim 1, wherein said plurality of semiconductor chips are arranged with a bonding surface faced up or in a flip-chip manner.

5. The package assembly according to claim 4, wherein at least one level of semiconductor chips are arranged with a bonding surface faced up and are electrically coupled to surfaces of said extension conductors by bonding wires.

6. The package assembly according to claim 4, wherein at least one level of semiconductor chips are arranged in a flip-chip manner and have conductive bumps for being soldered to surfaces of said extension conductors.

7. The package assembly according to claim 1, wherein said plurality of levels are two or more levels.

8. The package assembly according to claim 1, wherein said chip carrier is one selected from a group consisting of a leadframe and a printed circuit board.

9. A method for manufacturing a package assembly according to claim 1, comprising:
   a) mounting lowermost-level semiconductor chips on a chip carrier;
   b) encapsulating said lowermost-level semiconductor chips by an encapsulant layer;
   c) forming extension conductors on a surface of a lower-level encapsulant layer;
   d) mounting upper-level semiconductor devices on said extension conductors; and
   e) encapsulating said upper-level semiconductor chips by an encapsulant layer,
   wherein conductive vias are disposed before forming said extension conductors for said upper-level semiconductor devices so that said conductive vias penetrate said lower-level encapsulant layer and are exposed at a bottom surface of said package assembly.

10. The method according to claim 9, wherein said steps c) to e) are repeated so that a plurality of semiconductor chips are stacked in a plurality of upper levels.

11. The method according to claim 10, before said step a), further comprising disposing conductive vias for all of said upper-level semiconductor chips.

12. The method according to claim 11, wherein said step of disposing said conductive vias comprises disposing preformed conductive vias.

13. The method according to claim 10, between said step a) and said step b), further comprising disposing conductive vias for first upper-level semiconductor chips.

14. The method according to claim 10, between said step b) and said step c) for first upper-level of semiconductor chips, further comprising disposing conductive vias for first upper-level semiconductor chips.

15. The method according to claim 14, wherein said step of disposing said conductive vias comprises forming openings in said encapsulant layer for encapsulating said previous upper-level semiconductor chips, and forming conductive vias in said openings.

16. The method according to claim 10, between said step d) and said step e) for previous upper-level of semiconductor chips, further comprising disposing conductive vias for subsequent upper-level of semiconductor chips.

17. The method according to claim 10, between said step e) for previous upper-level of semiconductor chips and said step c) for subsequent upper-level of semiconductor chips, further comprising disposing conductive vias for said subsequent upper-level of semiconductor chips.

18. The method according to claim 9, wherein each level of said semiconductor chips are arranged with a bonding surface faced up or in a flip-chip manner.

19. The method according to claim 9, wherein said step c) comprises:
   forming a metal layer by plating on an encapsulant layer for encapsulating a previous upper-level semiconductor chips;
   forming a photoresist mask on said metal layer; and
   patterning said metal layer into said extension conductors by etching through said photoresist mask.

* * * * *